(12) United States Patent
Djordjevic (10) Patent No.: US 7,839,712 B2
(45) Date of Patent: Nov. 23, 2010

(54) SEMICONDUCTOR MEMORY ARRANGEMENT

(75) Inventor: Srdjan Djordjevic, Munich (DE)

(73) Assignee: Qimonda AG, Munich (DE)

( * ) Notice: Subject to any disclaimer, the term of this patent is extended or adjusted under 35 U.S.C. 154(b) by 602 days.

(21) Appl. No.: 11/833,841

(22) Filed: Aug. 3, 2007

(65) Prior Publication Data

US 2009/0037683 A1    Feb. 5, 2009

(51) Int. Cl.
*G11C 8/00* (2006.01)
(52) U.S. Cl. .................. 365/230.01; 365/51; 365/63; 365/212
(58) Field of Classification Search ............ 365/230.01, 365/51, 212, 63
See application file for complete search history.

(56) References Cited

U.S. PATENT DOCUMENTS

| | | | |
|---|---|---|---|
| 6,229,726 B1 * | 5/2001 | Wang et al. | 365/51 |
| 6,628,538 B2 * | 9/2003 | Funaba et al. | 365/63 |
| 6,751,113 B2 * | 6/2004 | Bhakta et al. | 365/63 |
| 7,411,807 B2 * | 8/2008 | Taylor | 365/64 |
| 2008/0301349 A1 * | 12/2008 | Bacha | 710/306 |

\* cited by examiner

*Primary Examiner*—Pho M Luu
(74) *Attorney, Agent, or Firm*—Slater & Matsil, L.L.P.

(57) ABSTRACT

A semiconductor memory arrangement includes a substrate, a first control device disposed on the substrate and adapted to receive command and address signals, a second control device, and a plurality of memory units. The second control device is adapted to receive the command and address signals from the first control device and to transmit the command and address signals to the memory units of the plurality of memory units.

31 Claims, 7 Drawing Sheets

SEMICONDUCTOR MEMORY ARRANGEMENT

DETAILED DESCRIPTION OF ILLUSTRATIVE EMBODIMENTS

In the following description, further aspects and embodiments of the present invention are summarized. In addition, reference is made to the accompanying drawings, which form a part hereof, and in which is shown by way of illustration, ways in which the invention may be practiced. The embodiments of the drawings present a summary in order to provide a better understanding of one or more aspects of the present invention. This summary is not an extensive overview of the invention and neither intended to limit the features or key-elements of the invention to a specific embodiment. Rather, the different elements, aspects and features disclosed in the embodiments can be combined in different ways by a person skilled in the art to achieve one or more advantages of the present invention. It is to be understood that other embodiments may be utilized and structural or logical changes may be made without departing from the scope of the present invention. The elements of the drawings are not necessarily to scale relative to each other. Like reference numerals designate corresponding similar parts.

Figure 1:
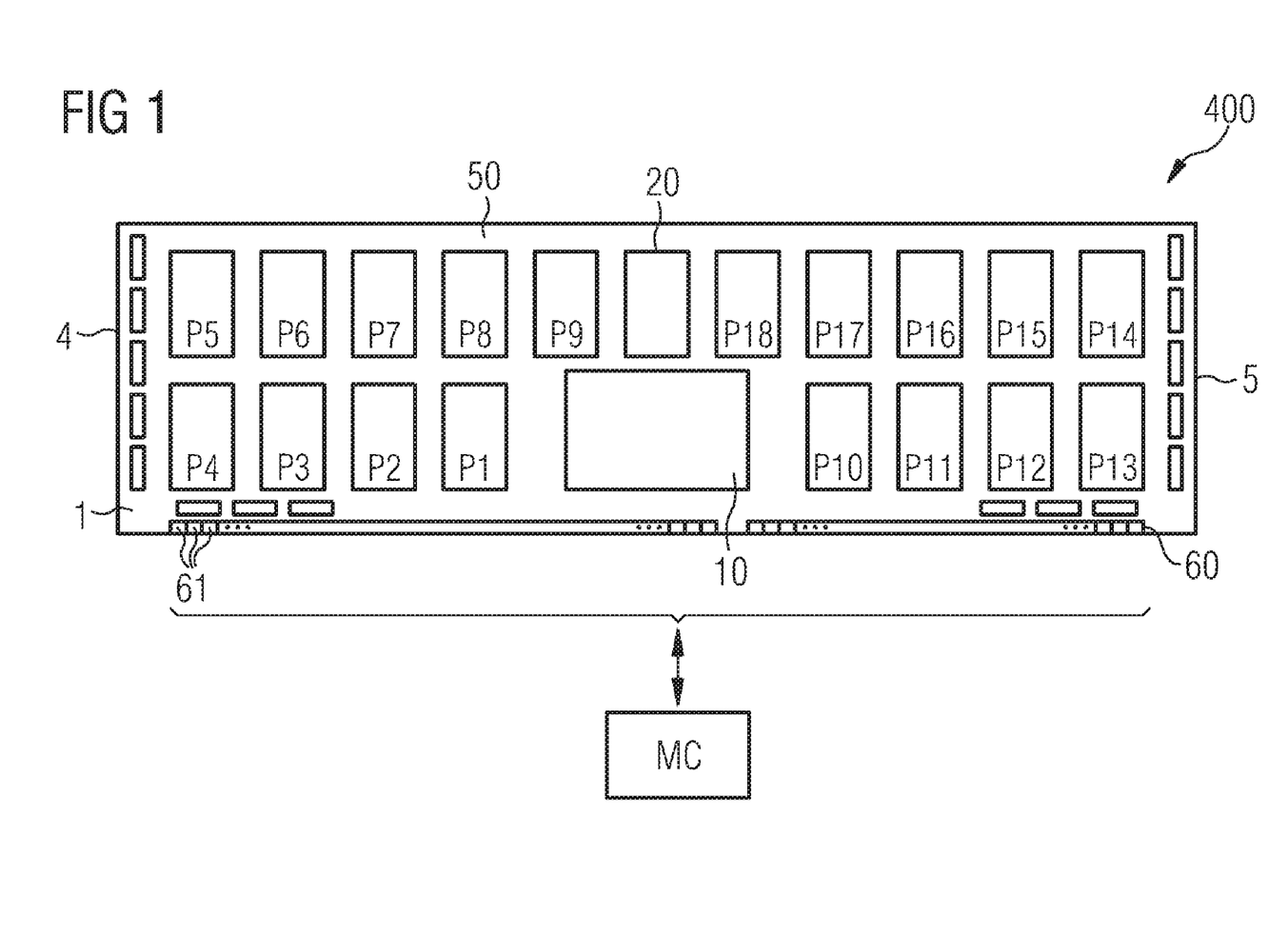
FIG. 1 shows an embodiment of a system topology comprising a controller unit and a semiconductor memory arrangement.

FIG. 1 shows a system topology comprising a controller unit MC, for example a memory controller, and at least one semiconductor memory arrangement 400 coupled to the controller unit MC via a bus system for the transmission of signals. The system topology may comprise a plurality of semiconductor memory arrangements 400 coupled to the controller unit MC via the bus system. The semiconductor memory arrangement 400 may be a semiconductor memory module, for example a Fully Buffered Dual In-Line Memory Module (FB-DIMM). The semiconductor memory arrangement 400 comprises a substrate 50 having a first main surface 1 and a first and a second end 4, 5. Memory units P1, . . . , P18, a first control device 10 and a second control device 20 are disposed on the first main surface 1 of the substrate 50. Another second control device and memory units P19, . . . , P36 are disposed on a second main surface of the substrate 50 (not shown in FIG. 1). The first and the second main surfaces of the substrate 50 may correspond to a top side and a bottom side, respectively, of the substrate 50.

A connector element 60 comprising a multiplicity of contacts 61 is disposed at an end of the substrate 50. In an embodiment, the connector element 60 is an edge connector. The contacts 61 are coupled to inputs of the first control device 10 via conductive lines disposed in the substrate 50 (not shown in FIG. 1). In another embodiment, the conductive lines (not shown) are disposed on the substrate 50.

The controller unit MC is adapted to transmit signals, for example, control signals, command and address signals, clock signals and data signals, to the first control device 10 via a bus system coupled to the contacts 61 of the connector element 60 of the substrate 50. Furthermore, the controller unit MC is adapted to receive signals from the first control device 10 via the bus system.

Figure 2:
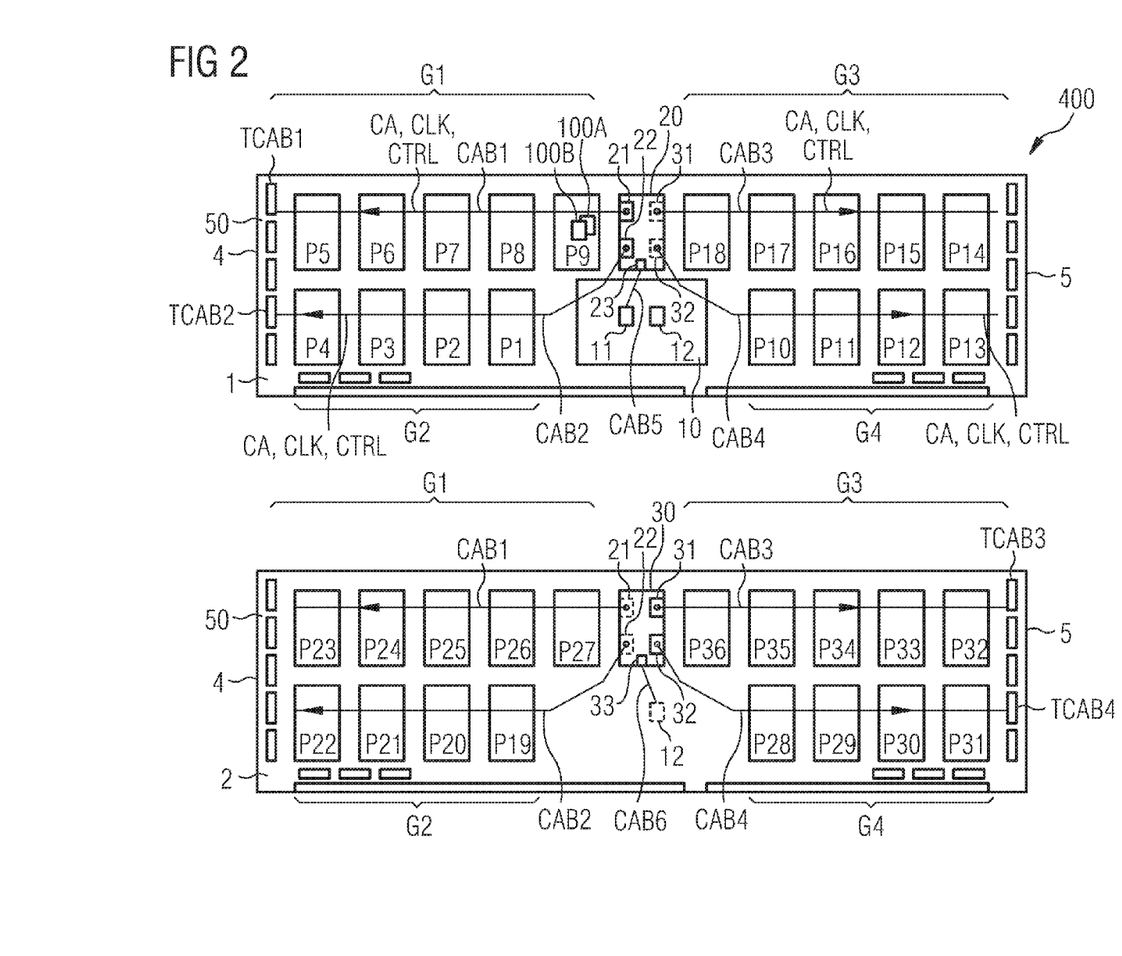
FIG. 2, FIG. 3, FIG. 4, FIG. 5 and FIG. 6 show plan views of respective first main surfaces of embodiments of semiconductor memory arrangements and plan views of respective second main surfaces of the embodiments of the semiconductor memory arrangements.

FIG. 2 shows a plan view of a first main surface 1 of an embodiment of a semiconductor memory arrangement and a plan view of a second main surface 2 of the embodiment of the semiconductor memory arrangement. The semiconductor memory arrangement 400 comprises a substrate 50 having a first and a second end 4, 5. A plurality of memory units P1, . . . , P36 are disposed on the first main surface 1 and on the second main surface 2 of the substrate 50. The first main surface 1 of the substrate 50 corresponds to a top side of the substrate 50 and the second main surface 2 of the substrate 50 corresponds to a bottom side of the substrate 50. Each of the memory units P1, . . . , P36 of the plurality of memory units comprises a first memory chip 100A and a second memory chip 100B. In an embodiment, the respective first memory chips 100A of each of the memory units P1, . . . , P36 are disposed on one of the first and the second main surfaces 1, 2 of the substrate 50 and the respective second memory chips 100B of the corresponding memory unit P1, . . . , P36 are disposed on the corresponding first memory chip 100A. Alternatively, each of the memory units P1, . . . , P36 may also comprise one memory chip or more than two memory chips.

The first and second memory chips 100A and 100B of each of the memory units P1, . . . , P36 may be dynamic random access (DRAM) memory chips. The first and second memory chips 100A and 100B of each of the memory units P1, . . . , P36 may also be synchronous dynamic random access (SDRAM) memory chips.

The substrate 50 may be a circuit board, for example a printed circuit board, having a multiplicity of conductive and structured layers disposed between the first main surface 1 and the second main surface 2, wherein respective insulating layers are disposed between adjacent conductive and structured layers (not shown in FIG. 2).

A first control device 10 and a second control device 20 are disposed on the first main surface 1 of the substrate 50. Furthermore, the memory units P1, . . . , P18 are disposed on the first main surface 1 of the substrate 50. An other second control device 30 and the memory units P19, . . . , P36 are disposed on the second main surface 2 of the substrate 50.

Memory units P5, . . . , P9 of a subset of a first group G1 of memory units are disposed between the second control device 20 and the first end 4 of the substrate 50 on the first main surface 1 of the substrate 50. Memory units P1, . . . , P4 of a subset of a second group G2 of memory units are disposed on the first main surface 1 of the substrate 50 between the first control device 10 and the first end 4 of the substrate 50. Memory units P14, . . . , P18 of a subset of a third group G3 of memory units are disposed between the second control device 20 and the second end 5 of the substrate 50 on the first main surface 1 of the substrate 50. Memory units P10, . . . , P13 of a subset of a fourth group G4 of memory units are disposed between the first control device 10 and the second end 5 of the substrate 50 on the first main surface 1 of the substrate 50.

Memory units P23, . . . , P27 of an other subset of the first group G1 of memory units are disposed on the second main surface 2 of the substrate 50 between the first end 4 of the substrate 50 and the other second control device 30. Memory units P19, . . . , P22 of an other subset of the second group G2 of memory units are disposed between the first end 4 of the substrate 50 and the first control device 10 on the second main surface 2 of the substrate 50. Memory units P32, . . . , P36 of an other subset of the third group G3 of memory units are disposed between the other second control device 30 and the second end 5 of the substrate 50 on the second main surface 2 of the substrate 50. Memory units P28, ..., P31 of an other subset of the fourth group G4 of memory units are disposed on the second main surface 2 of the substrate 50 between the first control device 10 and the second end 5 of the substrate 50.

The first control device 10 is adapted to receive signals, for example, control signals, command and address signals and clock signals, from a controller such as the memory controller MC shown in FIG. 1, to buffer the received control signals, command and address signals and clock signals, to redrive the buffered control signals, command and address signals and clock signals, and to transmit the control signals, command and address signals and clock signals to the second control device 20 and to the other second control device 30. The first control device 10 may be an advanced memory buffer chip and the second control device 20 and the other second control device 30 may be register chips.

The first control device 10 may be adapted to transmit a first half of the received control signals, command and address signals and clock signals to the second control device 20 and a second half of the received control signals, command and address signals and clock signals to the other second control device 30.

The second control device 20 is adapted to receive the control signals, command and address signals and clock signals from the first control device 10, to buffer the received control signals, command and address signals and clock signals, to redrive the buffered control signals, command and address signals and clock signals, and to transmit the control signals, command and address signals and clock signals to the memory units P5, ..., P9, P23, ..., P27 of the first group G1 of memory units and to the memory units P1, ..., P4, P19, ..., P22 of the second group G2 of memory units.

The other second control device 30 is adapted to receive the control signals, command and address signals and clock signals from the first control device 10, to buffer the received control signals, command and address signals and clock signals, to redrive the buffered control signals, command and address signals and clock signals, and to transmit the control signals, command and address signals and clock signals to the memory units P14, ..., P18, P32, ..., P36 of the third group G3 of memory units and to the memory units P10, ..., P13, P28, ..., P31 of the fourth group G4 of memory units.

The first control device 10 is coupled to the second control device 20 via a bus system CAB5 comprising a plurality of conductive lines coupled to respective outputs of the first control device 10 and to respective inputs of the second control device 20 to transmit the control signals, command and address signals and clock signals from the first control device 10 to the second control device 20. For example, one line of the bus system CAB5 is shown in FIG. 2, the one line coupling a first output 11 of the first control device 10 to an input 23 of the second control device 20.

The first control device 10 is coupled to the other second control device 30 via a bus system CAB6 comprising a plurality of conductive lines coupled to respective outputs of the first control device 10 and to respective inputs of the other second control device 30 to transmit the control signals, command and address signals and clock signals from the first control device 10 to the other second control device 30. For example, one line of the bus system CAB6 is shown in FIG. 2, the one line coupling a second output 12 of the first control device 10 to an input 33 of the other second control device 30.

A first bus system CAB1 comprising a plurality of conductive lines, wherein only one line is shown in FIG. 2, is coupled to the second control device 20 and to the memory units P5, ..., P9, P23, ..., P27 of the first group G1 of memory units to transmit the received control signals CTRL, command and address signals CA and clock signals CLK from the second control device 20 to the memory units of the first group G1 of memory units. For example, a first end of the one line of the first bus system CAB1 is coupled to a first output 21 of the second control device 20, a second end of the one line of the first bus system is coupled to a resistor TCAB1 and the memory units of the first group G1 of memory units are coupled to the one line between the first end and the second end of the one line.

A second bus system CAB2 comprising a plurality of conductive lines, wherein only one line is shown in FIG. 2, is coupled to the second control device 20 and to the memory units P1, ..., P4, P19, ..., P22 of the second group G2 of memory units to transmit the received control signals CTRL, command and address signals CA and clock signals CLK from the second control device 20 to the memory units of the second group G2 of memory units. For example, a first end of the one line of the second bus system CAB2 is coupled to a second output 22 of the second control device 20, a second end of the one line of the second bus system CAB2 is coupled to a resistor TCAB2 and the memory units of the second group G2 of memory units are coupled to the one line between the first and the second ends of the one line of the second bus system CAB2.

A third bus system CAB3 comprising a plurality of conductive lines, wherein only one line is shown in FIG. 2, is coupled to the other second control device 30 and to the memory units P14, ..., P18, P32, ..., P36 of the third group G3 of memory units to transmit the received control signals CTRL, command and address signals CA and clock signals CLK from the other second control device 30 to the memory units of the third group G3 of memory units. For example, a first end of the one line of the third bus system CAB3 is coupled to a first output 31 of the other second control device 30, a second end of the one line of the third bus system CAB3 is coupled to a resistor TCAB3 and the memory units of the third group G3 of memory units are coupled to the one line between the first end and the second end of the one line of the third bus system CAB3.

A fourth bus system CAB4 comprising a plurality of conductive lines, wherein only one line is shown in FIG. 2, is coupled to the other second control device 30 and to the memory units P10, ..., P13, P28, ..., P31 of the fourth group G4 of memory units to transmit the received control signals CTRL, command and address signals CA and clock signals CLK from the other second control device 30 to the memory units of the fourth group G4 of memory units. For example, a first end of the one line of the fourth bus system CAB4 is coupled to a second output 32 of the other second control device 30, a second end of the one line of the fourth bus system CAB4 is coupled to a resistor TCAB4 and the memory units of the fourth group G4 of memory units are coupled to the one line between the first end and the second end of the one line of the fourth bus system CAB4.

The first bus system CAB1, the second bus system CAB2, the third bus system CAB3 and the fourth bus system CAB4 may be disposed in respective conductive and structured layers of the substrate 50 (not shown in FIG. 2).

The semiconductor memory arrangement may also comprise only one second control device coupled to the first control device via a bus system to transmit the control signals, the command and address signals and the clock signals from the first control device to the second control device (not shown in FIG. 2). The second control device is coupled to the memory units of two groups of memory units via respective bus systems to transmit the control signals, command and address signals and clock signals to the memory units of the two groups of memory units. Furthermore, the first control device is coupled to the memory units of the other two groups of memory units via respective bus systems (not shown in FIG. 2) to transmit the control signals, command and address signals and clock signals to the memory units of the other two groups of memory units.

Figure 3:
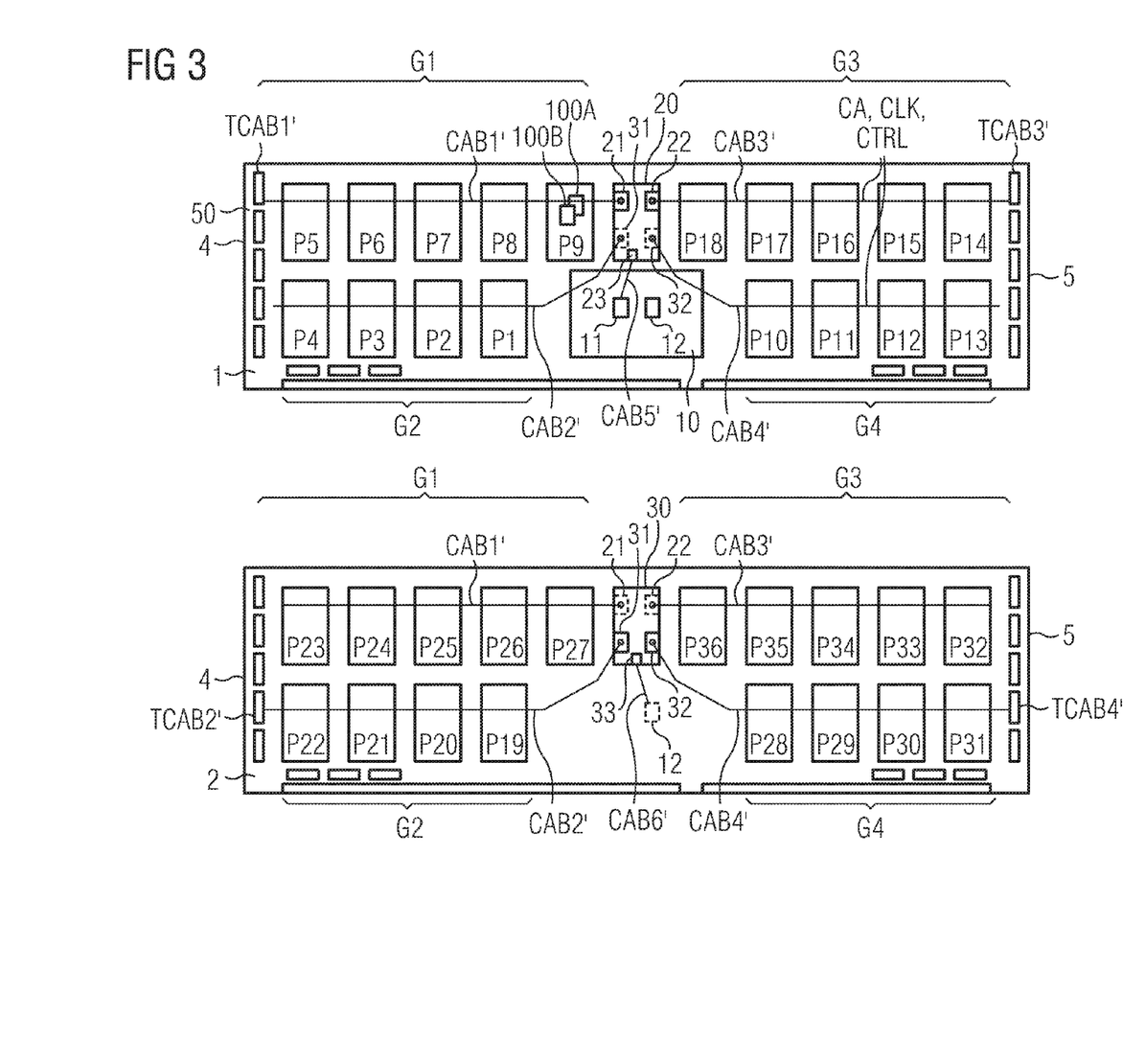

FIG. 3 shows a plan view of a first main surface 1 of an embodiment of a semiconductor memory arrangement and a plan view of a second main surface 2 of the embodiment of the semiconductor memory arrangement. The semiconductor memory arrangement shown in FIG. 3 is similar to the semiconductor memory arrangement shown in FIG. 2.

The first control device 10 is coupled to the second control device 20 via a bus system CAB5' comprising a plurality of conductive lines coupled to respective outputs of the first control device 10 and to respective inputs of the second control device 20 to transmit the control signals, command and address signals and clock signals from the first control device 10 to the second control device 20. For example, one line of the bus system CAB5' is shown in FIG. 3, the one line coupling a first output 11 of the first control device 10 to an input 23 of the second control device 20.

The first control device 10 is coupled to the other second control device 30 via a bus system CAB6' comprising a plurality of conductive lines coupled to respective outputs of the first control device 10 and to respective inputs of the other second control device 30 to transmit the control signals, command and address signals and clock signals from the first control device 10 to the other second control device 30. For example, one line of the bus system CAB6 is shown in FIG. 3, the one line coupling a second output 12 of the first control device 10 to an input 33 of the other second control device 30.

A first bus system CAB1' comprising a plurality of conductive lines, wherein only one line is shown in FIG. 3, is coupled to the second control device 20 and to the memory units P5, . . . , P9, P23, . . . , P27 of the first group G1 of memory units to transmit the received control signals CTRL, command and address signals CA and clock signals CLK from the second control device 20 to the memory units of the first group G1 of memory units. For example, a first end of the one line of the first bus system CAB1' is coupled to a first output 21 of the second control device 20, a second end of the one line of the first bus system is coupled to a resistor TCAB1' and the memory units of the first group G1 of memory units are coupled to the one line between the first end and the second end of the one line.

A second bus system CAB2' comprising a plurality of conductive lines, wherein only one line is shown in FIG. 3, is coupled to the other second control device 30 and to the memory units P1, . . . , P4, P19, . . . , P22 of the second group G2 of memory units to transmit the received control signals CTRL, command and address signals CA and clock signals CLK from the second control device 20 to the memory units of the second group G2 of memory units. For example, a first end of the one line of the second bus system CAB2' is coupled to the first output 31 of the other second control device 30, a second end of the one line of the second bus system CAB2' is coupled to a resistor TCAB2' and the memory units of the second group G2 of memory units are coupled to the one line between the first and the second end of the one line of the second bus system CAB2'.

A third bus system CAB3' comprising a plurality of conductive lines, wherein only one line is shown in FIG. 3, is coupled to the second control device 20 and to the memory units P14, . . . , P18, P32, . . . , P36 of the third group G3 of memory units to transmit the received control signals CTRL, command and address signals CA and clock signals CLK from the second control device 20 to the memory units of the third group G3 of memory units. For example, a first end of the one line of the third bus system CAB3' is coupled to a second output 22 of the second control device 20, a second end of the one line of the third bus system CAB3' is coupled to a resistor TCAB3' and the memory units of the third group G3 of memory units are coupled to the one line between the first end and the second end of the one line of the third bus system CAB3'.

A fourth bus system CAB4' comprising a plurality of conductive lines, wherein only one line is shown in FIG. 3, is coupled to the other second control device 30 and to the memory units P10, . . . , P13, P28, . . . , P31 of the fourth group G4 of memory units to transmit the received control signals CTRL, command and address signals CA and clock signals CLK from the other second control device 30 to the memory units of the fourth group G4 of memory units. For example, a first end of the one line of the fourth bus system CAB4' is coupled to a second output 32 of the other second control device 30, a second end of the one line of the fourth bus system CAB4' is coupled to a resistor TCAB4' and the memory units of the fourth group G4 of memory units are coupled to the one line between the first end and the second end of the one line of the fourth bus system CAB4'.

The first bus system CAB1', the second bus system CAB2', the third bus system CAB3' and the fourth bus system CAB4' may be disposed in respective conductive and structured layers of the substrate 50 (not shown in FIG. 3).

Figure 4:
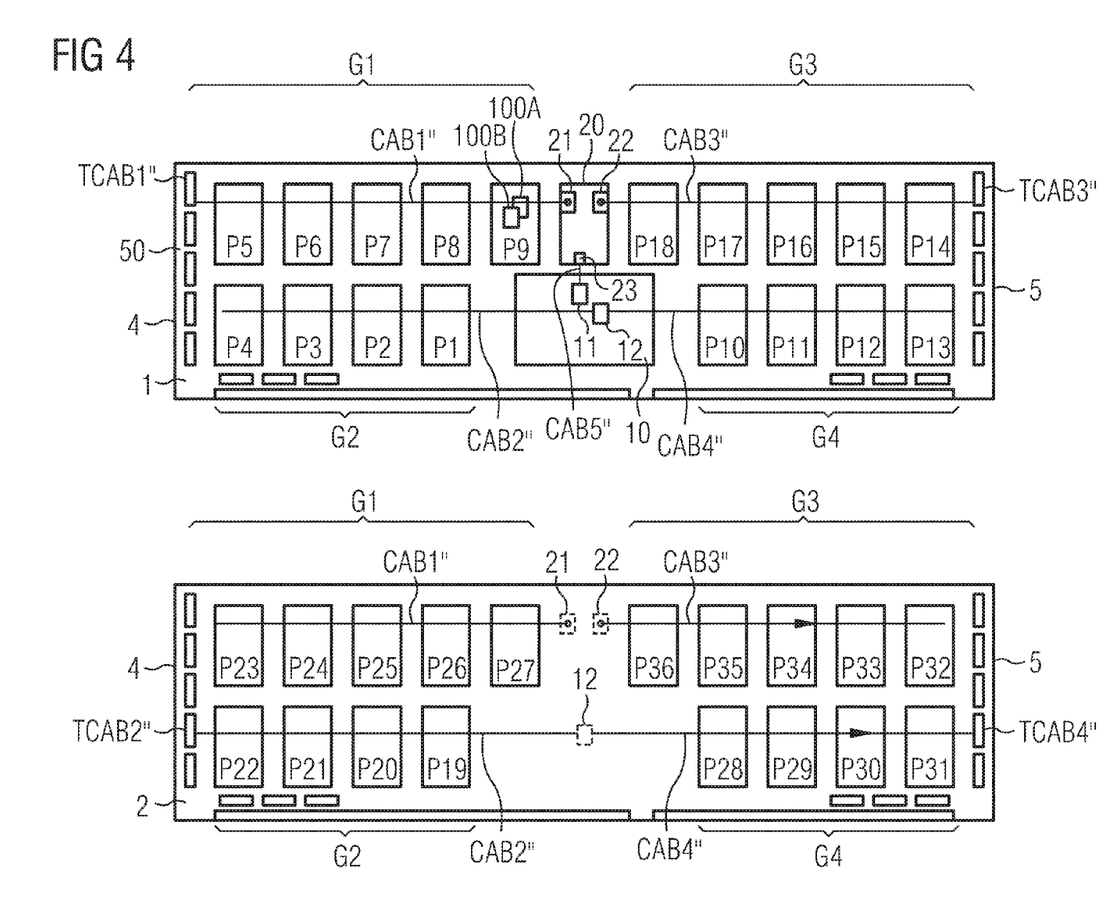

FIG. 4 shows a plan view of a first main surface 1 of an embodiment of a semiconductor memory arrangement and a plan view of a second main surface 2 of the embodiment of the semiconductor memory arrangement. The semiconductor memory arrangement shown in FIG. 4 is similar to the semiconductor memory arrangements shown in FIG. 2 and FIG. 3, wherein the semiconductor memory arrangement shown in FIG. 4 only comprises the second control device 20.

The second control device 20 is coupled to the memory units of two groups of memory units of the four groups G1, G2, G3, G4 of memory units via respective bus systems to transmit the control signals, command and address signals and clock signals from the second control device 20 to the memory units of the two groups of memory units. Furthermore, the first control device 10 is coupled to the memory units of the other two groups of memory units via respective bus systems to transmit the control signals, command and address signals and clock signals from the first control device 10 to the memory units of the other two groups of memory units.

The first control device 10 is coupled to the second control device 20 via a bus system CAB5" comprising a plurality of conductive lines coupled to respective outputs of the first control device 10 and to respective inputs of the second control device 20 to transmit the control signals, command and address signals and clock signals from the first control device 10 to the second control device 20. For example, one line of the bus system CAB5" is shown in FIG. 4, the one line coupling a first output 11 of the first control device 10 to an input 23 of the second control device 20.

A first bus system CAB1" comprising a plurality of conductive lines, wherein only one line is shown in FIG. 4, is coupled to the second control device 20 and to the memory units P5, . . . , P9, P23, . . . , P27 of the first group G1 of memory units to transmit the received control signals CTRL, command and address signals CA and clock signals CLK from the second control device 20 to the memory units of the first group G1 of memory units. For example, a first end of the one line of the first bus system CAB1" is coupled to a first output 21 of the second control device 20, a second end of the one line of the first bus system CAB1" is coupled to a resistor TCAB1" and the memory units of the first group G1 of memory units are coupled to the one line between the first end and the second end of the one line.

A second bus system CAB2" comprising a plurality of conductive lines, wherein only one line is shown in FIG. 4, is coupled to the first control device 10 and to the memory units P1, . . . , P4, P19, . . . , P22 of the second group G2 of memory units to transmit the received control signals CTRL, command and address signals CA and clock signals CLK from the first control device 10 to the memory units of the second group G2 of memory units. For example, a first end of the one line of the second bus system CAB2" is coupled to a second output 12 of the first control device 10, a second end of the one line of the second bus system CAB2" is coupled to a resistor TCAB2" and the memory units of the second group G2 of memory units are coupled to the one line between the first and the second ends of the one line of the second bus system CAB2".

A third bus system CAB3" comprising a plurality of conductive lines, wherein only one line is shown in FIG. 4, is coupled to the second control device 20 and to the memory units P14, . . . , P18, P32, . . . , P36 of the third group G3 of memory units to transmit the received control signals CTRL, command and address signals CA and clock signals CLK from the second control device 20 to the memory units of the third group G3 of memory units. For example, a first end of the one line of the third bus system CAB3" is coupled to a second output 22 of the second control device 20, a second end of the one line of the third bus system CAB3" is coupled to a resistor TCAB3" and the memory units of the third group G3 of memory units are coupled to the one line between the first end and the second end of the one line of the third bus system CAB3".

A fourth bus system CAB4" comprising a plurality of conductive lines, wherein only one line is shown in FIG. 4, is coupled to the first control device 10 and to the memory units P10, . . . , P13, P28, . . . , P31 of the fourth group G4 of memory units to transmit the received control signals CTRL, command and address signals CA and clock signals CLK from the first control device 10 to the memory units of the fourth group G4 of memory units. For example, a first end of the one line of the fourth bus system CAB4" is coupled to the second output 12 of the first control device 10, a second end of the one line of the fourth bus system CAB4" is coupled to a resistor TCAB4" and the memory units of the fourth group G4 of memory units are coupled to the one line between the first end and the second end of the one line of the fourth bus system CAB4".

The first bus system CAB1", the second bus system CAB2", the third bus system CAB3" and the fourth bus system CAB4" may be disposed in respective conductive and structured layers of the substrate 50 (not shown in FIG. 4).

In the embodiments shown in FIG. 2, FIG. 3 and FIG. 4, the respective semiconductor memory arrangements each comprise four groups of memory units, wherein the memory units are arranged in respective two rows extending between long ends of the substrate 50 on the first main surface 1 and on the second main surface 2 of the substrate 50.

In another embodiment (not shown), a semiconductor memory arrangement may comprise six groups of memory units, wherein the first control device is coupled to memory units of two groups of memory units via a bus system to transmit the control signals, command and address signals and clock signals from the first control device to the memory units of the two groups of memory units. The second control device is coupled to memory units of two other groups of memory units via a bus system to transmit the control signals, command and address signals and clock signals from the second control device to the memory units of the two other groups of memory units. The other second control device is coupled to memory units of two further other groups of memory units via a bus system to transmit the control signals, command and address signals and clock signals from the other second control device to the memory units of the two further other groups of memory units. The memory units of the six groups of memory units may be arranged in respective three rows extending between long ends of the substrate on the first main surface and on the second main surface of the substrate.

Figure 5:
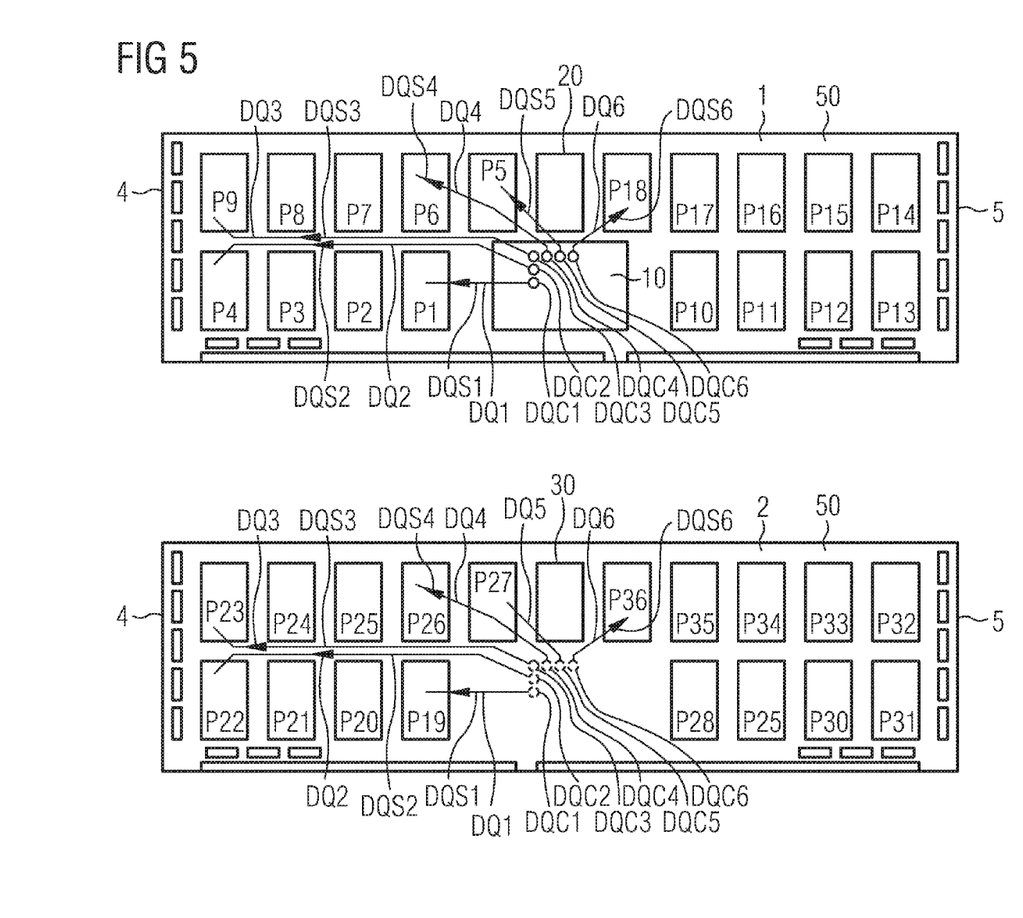

FIG. 5 shows an embodiment of a semiconductor memory arrangement as depicted in FIG. 2, FIG. 3, or FIG. 4, wherein the embodiment of the semiconductor memory arrangement of FIG. 4 only comprises the second control device 20. The first control device 10 is adapted to receive data signals DQS1, . . . , DQS6 from a controller such as the memory controller MC shown in FIG. 1 and to transmit a respective data signal to respective two memory units of the first group of memory units, wherein one of the two memory units is disposed on one main surface of the substrate and the respective other memory unit is disposed on the other main surface of the substrate opposite the one memory unit.

The first control device is adapted to transmit a respective data signal to a first and a second memory unit of the first group G1 of memory units, a respective data signal to a first and a second memory unit of the second group G2 of memory units, a respective data signal to a first and a second memory unit of the third group G3 of memory units and a respective data signal to a first and a second memory unit of the fourth group G4 of memory units.

The first control device 10 transmits a respective data signal to a first memory unit and a second memory unit of the first group G1 of memory units, a respective data signal to a first memory unit and a second memory unit of the second group G2 of memory units, a respective data signal to a first memory unit and a second memory unit of the third group of memory units and a respective data signal to a first memory unit and a second memory unit of the fourth group G4 of memory units, wherein the respective first memory unit of each of the groups of memory units is disposed on one surface of the first and second main surfaces 1, 2 of the substrate 50, and wherein the respective second memory unit of each of the groups of memory units is disposed opposite the corresponding first memory unit on the other surface of the first and second main surfaces 1, 2 of the substrate 50.

If the first control device 10 would transmit the data signals to the memory units and the corresponding control signals, command and address signals and clock signals to the second control device and the other second control device, respectively, at the same time, the control signals, the command and address signals and the clock signals would arrive later at the corresponding memory units than the data signals, since the control signals, the command and address signals and the clock signals are transmitted via the second control device 20 or the other second control device 30 to the memory units which results in a delay of the control signals, the command and address signals and the clock signals. Therefore, the first control device 10 delays the transmission of the data signals to the memory units compared to the transmission of the control signals, command and address signals and clock signals to the second control device and the other second control device, respectively, such that the data signals and the control signals, command and address signals and clock signals arrive within 1 ps at the respective memory units.

Memory chips, which receive the same data signal from the first control device 10, belong to a respective rank of memory chips. In the embodiment depicted in FIG. 5, the memory chips of the memory units P1 and P19 belong to a first rank of memory chips, the memory chips of the memory units P2 and P20 belong to a second rank of memory chips, and the memory chips of the memory units P3 and P21 belong to a third rank of memory chips. The memory chips of the memory units P4 and P22 belong to a fourth rank of memory chips, the memory chips of the memory units P9 and P23 belong to a fifth rank of memory chips, the memory chips of the memory units P8 and P24 belong to a sixth rank of memory chips, the memory chips of the memory units P7 and P25 belong to a seventh rank of memory chips, the memory chips of the memory units P6 and P26 belong to an eighth rank of memory chips, and the memory chips of the memory units P5 and P27 belong to a ninth rank of memory chips, for example. In the embodiment shown in FIG. 5, the semiconductor memory module is configured as a 4Rx4 semiconductor memory module.

The first control device 10 transmits the data signal DQS1 via a conductive connection DQ1 coupled to the output DQC1 of the first control device 10 and to the memory units P1 and P19 to the memory units P1 and P9 and the data signal DQS2 via a conductive connection DQ2 coupled to the output DQC2 of the first control device 10 and to the memory units P4 and P22 to the memory units P4 and P22.

The first control device 10 transmits the data signal DQS3 via a conductive connection DQ3 coupled to the output DQC3 of the first control device 10 and to the memory units P9 and P23 to the memory units P9 and P23 and the data signal DQS4 via a conductive connection DQ4 coupled to the output DQC4 of the first control device 10 and to the memory units P6 and P26 to the memory units P6 and P26.

The first control device 10 transmits the data signal DQS5 via a conductive connection DQ5 coupled to the output DQC5 of the first control device 10 and to the memory units P5 and P27 to the memory units P5 and P27 and the data signal DQS6 via a conductive connection DQ6 coupled to the output DQC6 of the first control device 10 and to the memory units P18 and P36 to the memory units P18 and P36.

The memory units P10, . . . , P17, P28, . . . , P35 are correspondingly coupled to further outputs of the first control device to transmit respective data signals from the first control device 10 to the respective memory units. In an embodiment, the outputs of the first control device 10 to transmit respective data signals to respective memory units are assigned to two groups, wherein the outputs of one of the two groups of outputs are coupled to memory units of two groups of memory units coupled to the second control device and the outputs of the other one of the two groups of outputs are coupled to memory units of the other two groups of memory units coupled to the other second control device and the first control device, respectively. The first group of outputs may be driven by the first control device 10 independently from the second group of outputs.

The first control device 10 is further adapted to receive data signals from the memory units. In the embodiment shown in FIG. 2, the first control device 10 may be adapted to receive data signals from the memory units of the first group G1 and of the second group G2, while simultaneously transmitting data signals to the memory units of the third group G3 and of the fourth group G4.

In the embodiment shown in FIG. 3, the first control device 10 may be adapted to receive data signals from the memory units of the first group G1 and of the third group G3, while simultaneously transmitting data signals to the memory units of the second group G2 and of the fourth group G4.

In the embodiment shown in FIG. 4, the first control device 10 may be adapted to receive data signals from the memory units of the first group G1 and of the third group G3, while simultaneously transmitting data signals to the memory units of the second group G2 and of the fourth group G4.

Figure 6:
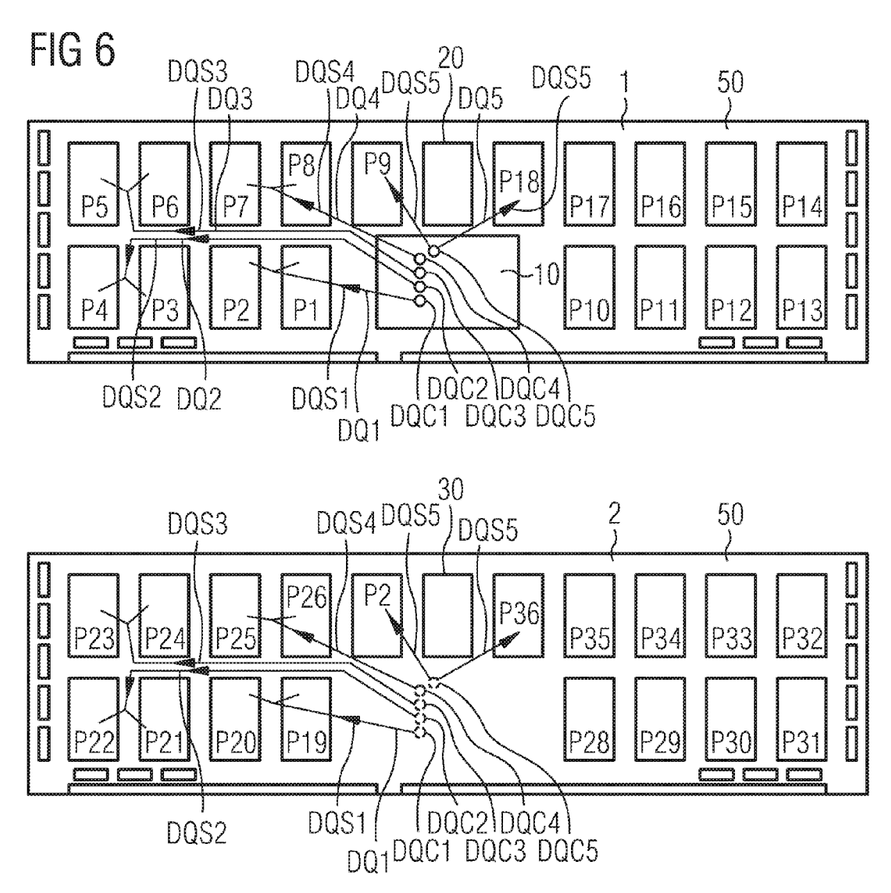

FIG. 6 shows an embodiment of a semiconductor memory arrangement as depicted in FIG. 2, FIG. 3, or FIG. 4, wherein the embodiment of the semiconductor memory arrangement of FIG. 4 only comprises the second control device 20. The first control device 10 is adapted to receive data signals DQS1, . . . , DQS5 from a controller such as the memory controller MC shown in FIG. 1 and to transmit a respective data signal to four memory units of the first group G1 of memory units, wherein two of the four memory units are disposed adjacent to one another on one main surface of the first main surface 1 and the second main surface 2 of the substrate 50 and the respective other two memory units are disposed on the respective other main surface of the substrate 50 opposite the two memory units.

The first control device 10 is adapted to transmit a respective data signal to a first memory unit and to a respective second memory unit of the subset of the first group G1 of memory units and to a first memory unit and to a respective second memory unit of the other subset of the first group G1 of memory units.

The first control device 10 is adapted to transmit a respective data signal to a first memory unit and to a respective second memory unit of the subset of the second group G2 of memory units and to a first memory unit and to a respective second memory unit of the other subset of the second group G2 of memory units.

The first control device 10 is adapted to transmit a respective data signal to a first memory unit and to a respective second memory unit of the subset of the third group G3 of memory units and to a first memory unit and to a respective second memory unit of the other subset of the third group G3 of memory units.

The first control device 10 is adapted to transmit a respective data signal to a first memory unit and to a respective second memory unit of the subset of the fourth group G4 of memory units and to a first memory unit and to a respective second memory unit of the other subset of the fourth group G4 of memory units.

The respective first and the second memory units of the subsets of each of the first group G1 of memory units, the second group G2 of memory units, the third group G3 of memory units and the fourth group G4 of memory units are disposed adjacent to one another on one of the first main surface 1 and the second main surface 2 of the substrate 50. The corresponding respective first and second memory units of the other subsets of each of the first group G1 of memory units, the second group G2 of memory units, the third group G3 of memory units and the fourth group G4 of memory units are disposed opposite the corresponding first and second memory units of the subsets of each of the first group G1 of memory units, the second group G2 of memory units, the third group G3 of memory units and the fourth group G4 of memory units on the respective other main surface of the substrate 50.

Memory chips, which receive the same data signal from the first control device 10, belong to a respective rank of memory chips. In the embodiment depicted in FIG. 6, the memory chips of the memory units P1, P2, P19 and P20 belong to a first rank of memory chips, the memory chips of the memory units P3, P4, P21 and P22 belong to a second rank of memory chips, the memory chips of the memory units P5, P6, P23 and P24 belong to a third rank of memory chips, and the memory chips of the memory units P7, P8, P25 and P26 belong to a fourth rank of memory chips, for example. In the embodiment shown in FIG. 6, the semiconductor memory module is configured as an 8Rx8 semiconductor memory module.

The first control device 10 transmits the data signal DQS1 via a conductive connection DQ1 coupled to the output DQC1 of the first control device 10 and to the memory units P1, P2, P19 and P20 to the memory units P1, P2, P19 and P20 and the data signal DQS2 via a conductive connection DQ2 coupled to the output DQC2 of the first control device 10 and to the memory units P3, P4, P21 and P22 to the memory units P3, P4, P21 and P22.

The first control device 10 transmits the data signal DQS3 via a conductive connection DQ3 coupled to the output DQC3 of the first control device 10 and to the memory units P5, P6, P23 and P24 to the memory units P5, P6, P23 and P24 and the data signal DQS4 via a conductive connection DQ4 coupled to the output DQC4 of the first control device 10 and to the memory units P7, P8, P25 and P26 to the memory units P7, P8, P25 and P26.

The first control device 10 transmits the data signal DQS5 via a conductive connection DQ5 coupled to the output DQC5 of the first control device 10 and to the memory units P9, P18, P27 and P36 to the memory units P9, P18, P27 and P36.

The memory units P10, . . . , P17, P28, . . . , P35 are correspondingly coupled to further outputs of the first control device 10 to transmit respective data signals from the first control device 10 to the respective memory units. In an embodiment, the outputs of the first control device 10 to transmit respective data signals to respective memory units are assigned to two groups, wherein the outputs of one of the two groups of outputs are coupled to memory units of two groups of memory units coupled to the second control device 20 and the outputs of the other one of the two groups of outputs are coupled to memory units of the other two groups of memory units coupled to the other second control device 30 and the first control device 10, respectively. The first group of outputs may be driven by the first control device 10 independently from the second group of outputs.

The first control device 10 is further adapted to receive data signals from the memory units. In the embodiment shown in FIG. 2, the first control device 10 may be adapted to receive data signals from the memory units of the first group G1 and of the second group G2, while simultaneously transmitting data signals to the memory units of the third group G3 and of the fourth group G4.

In the embodiment shown in FIG. 3, the first control device 10 may be adapted to receive data signals from the memory units of the first group G1 and of the third group G3, while simultaneously transmitting data signals to the memory units of the second group G2 and of the fourth group G4.

In the embodiment shown in FIG. 4, the first control device 10 may be adapted to receive data signals from the memory units of the first group G1 and of the third group G3, while simultaneously transmitting data signals to the memory units of the second group G2 and of the fourth group G4.

Figure 7:
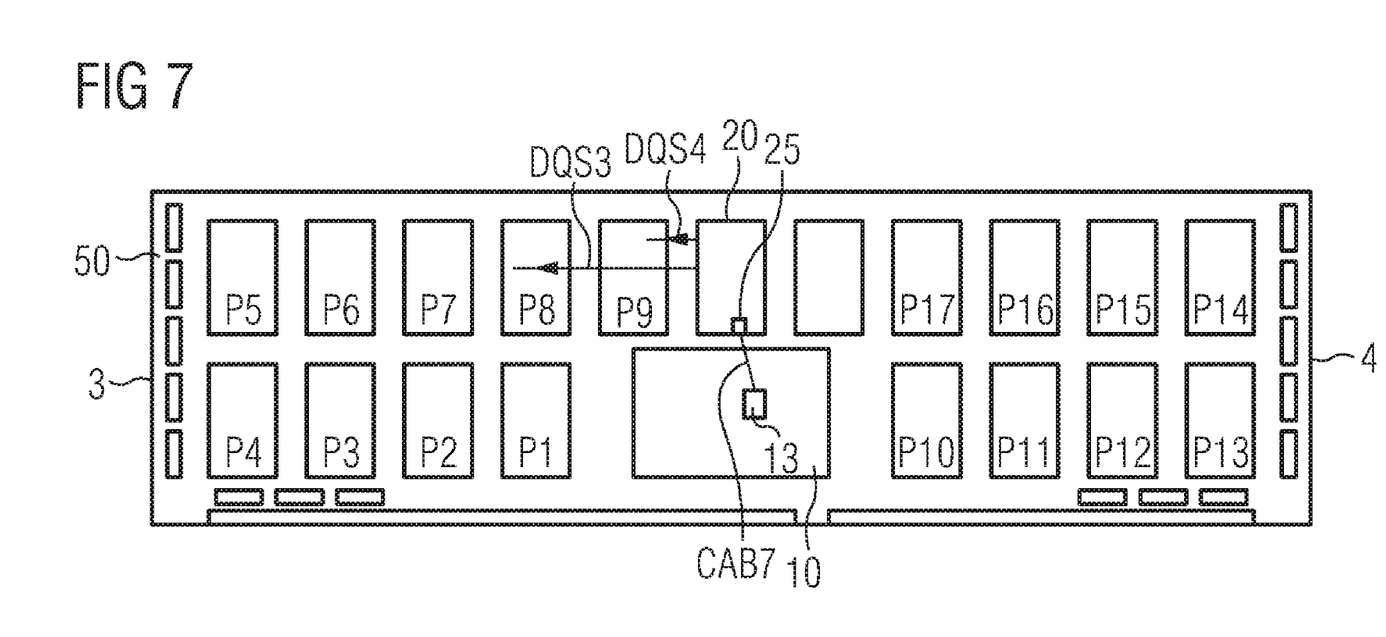
FIG. 7 shows a plan view of a main surface of an embodiment of a semiconductor memory arrangement.

FIG. 7 shows an embodiment of a semiconductor memory arrangement as depicted in FIG. 2, FIG. 3, or FIG. 4, wherein the embodiment of the semiconductor memory arrangement of FIG. 4 only comprises the second control device 20. The first control device 10 is adapted to receive data signals DQS3, DQS4 from a controller such as the memory controller shown in FIG. 1 and to transmit the data signals to the second control device via a bus system CAB7. The bus system CAB7 comprises a plurality of conductive lines from which one line is shown in FIG. 7 that is coupled to an output 13 of the first control device 10 and to an input 25 of the second control device 20.

The second control device 20 may be a buffer device which buffers the received data signals and transmits a respective data signal to respective memory chips of one rank of memory chips. The memory units may be assigned to respective ranks in accordance with the rank assignment described with regard to FIG. 5. The memory units may also be assigned to respective ranks in accordance with the rank assignment described with regard to FIG. 6.

Although specific embodiments have been illustrated and described herein, it will be appreciated by those of ordinary skill in the art that any arrangement which is calculated to achieve the same purpose may be substituted for the specific embodiments shown. It is to be understood that the above description is intended to be illustrative and not restrictive. This application is intended to cover any adaptations or variations of the invention. Combinations of the above embodiments and many other embodiments will be apparent to those of skill in the art upon reading and understanding the above description. The scope of the invention includes any other embodiments and applications in which the above structures and methods may be used. The scope of the invention should, therefore, be determined with reference to the appended claims along with the scope of equivalents to which such claims are entitled.

It is emphasized that the Abstract is provided to comply with 37 C.F.R. section 1.72(b) requiring an abstract that will allow the reader to quickly ascertain the nature and gist of the technical disclosure. It is submitted with the understanding that it will not be used to interpret or limit the scope or meaning of the claims.

What is claimed is:

1. A semiconductor memory arrangement comprising:
   a substrate;
   a first control device disposed on a first main surface of said substrate and adapted to receive command and address signals;
   a second control device disposed on said first main surface of said substrate; and
   a plurality of memory units, wherein
   said second control device is adapted to receive said command and address signals from said first control device and to transmit said command and address signals to memory units of said plurality of memory units.

2. The semiconductor memory arrangement according to claim 1, wherein said plurality of memory units comprises a first group of memory units and a second group of memory units.

3. The semiconductor memory arrangement according to claim 2, further comprising:
   a third group of memory units and a fourth group of memory units; and
   an other second control device adapted to receive said command and address signals from said first control device and to transmit said command and address signals to memory units of said third group of memory units and to memory units of said fourth group of memory units.

4. The semiconductor memory arrangement according to claim 3, wherein said substrate has a first end and a second end, wherein each of said memory units of said first group and said second group comprises a first memory chip, and wherein each of said memory units of said third group and said fourth group comprises a second memory chip, wherein said other second control device is disposed on a second main surface.

5. The semiconductor memory arrangement according to claim 4, wherein:
   a subset of said memory units of said first group of memory units is disposed on said first main surface of said substrate between said first end of said substrate and said second control device;
   an other subset of said memory units of said first group of memory units is disposed on said second main surface of said substrate between said first end of said substrate and said other second control device;
   a subset of said memory units of said third group of memory units is disposed on said first main surface of said substrate between said first end of said substrate and said first control device; and
   an other subset of said memory units of said third group of memory units is disposed on said second main surface of said substrate between said first end of said substrate and said first control device.

6. The semiconductor memory arrangement according to claim 4, wherein:
   a subset of said memory units of said first group of memory units is disposed on said first main surface of said substrate between said first end of said substrate and said second control device;
   an other subset of said memory units of said first group of memory units is disposed on said second main surface of said substrate between said first end of said substrate and said other second control device;
   a subset of said memory units of said third group of memory units is disposed on said first main surface of said substrate between said second control device and said second end of said substrate; and
   an other subset of said memory units of said third group of memory units is disposed on said second main surface of said substrate between said other second control device and said second end of said substrate.

7. The semiconductor memory arrangement according to claim 6, wherein said first control device is adapted to receive data signals and to transmit a respective data signal to a respective memory unit of one of said subsets of said first group, said second group, said third group and said fourth group of memory units and to a respective memory unit of said other subset of said one group of memory units, wherein said memory units of said other subset of said group is disposed opposite said memory unit of said subset of said group on said second main surface.

8. The semiconductor memory arrangement according to claim 6, wherein said first control device is adapted to receive data signals and to transmit a respective data signal to a respective first memory unit and to a respective second memory unit of one of said subsets of said first group, said second group, said third group and said fourth group of memory units, said first memory unit being disposed adjacent to said second memory unit, and to a respective first memory unit and to a respective second memory unit of said other subset of said one group of memory units, said second memory unit of said other subset being disposed adjacent to said first memory unit of said other subset of said one group, wherein said first memory unit of said other subset of said one group is disposed opposite said first memory unit of said subset of said one group on said second main surface and said second memory unit of said other subset of said one group is disposed opposite said second memory unit of said subset of said one group on said second main surface.

9. The semiconductor memory arrangement according to claim 6, wherein said first control device is adapted to receive data signals; and
   said second control device and said other second control device are adapted to receive said data signals from said first control device and to transmit a respective data signal to a respective memory unit of one of said subsets of said first group, said second group, said third group and said fourth group of memory units and to a respective memory unit of another subset of said group of memory units, wherein said memory unit of said other subset of said group is disposed opposite said memory unit of said subset of said group on said second main surface.

10. The semiconductor memory arrangement according to claim 1, further comprising an other plurality of memory units, wherein said first control device is adapted to transmit said command and address signals to memory units of said other plurality of memory units.

11. The semiconductor memory arrangement according to claim 1, further comprising a connector element disposed on said substrate, wherein said first control device is adapted to receive said command and address signals from said connector element.

12. A semiconductor memory module, comprising:
   a first control chip disposed on a first main surface of a circuit board, said first control chip adapted to receive command and address signals;
   a second control chip disposed on the first main surface of said circuit board and an other second control chip disposed on a second main surface of said circuit board; and
   a first group of memory units and a second group of memory units,
   wherein said second control chip is adapted to receive said command and address signals from said first control chip and to transmit said command and address signals to memory units of said first group of memory units, and
   wherein said other second control chip is adapted to receive said command and address signals from said first control chip and to transmit said command and address signals to memory units of said second group of memory units.

13. The semiconductor memory module according to claim 12, further comprising:
   the circuit board further comprising a first end and a second end, wherein
   a subset of said memory units of said first group of memory units is disposed on said first main surface of said circuit board and an other subset of said memory units of said first group of memory units is disposed opposite said subset of said memory units of said first group of memory units on said second main surface of said circuit board, and
   a subset of said memory units of said second group of memory units is disposed on said first main surface of said circuit board and an other subset of said memory units of said second group of memory units is disposed opposite said subset of said memory units of said second group of memory units on said second main surface of said circuit board.

14. The semiconductor memory module according to claim 13, wherein said memory units of said subset of said first group of memory units and said memory units of said subset of said second group of memory units are disposed between said second control chip and one of said first end and said second end of said circuit board.

15. The semiconductor memory module according to claim 13, wherein said memory units of said subset of said first group of memory units are disposed between said second control chip and one of said first end and said second end of said circuit board, and wherein said memory units of said subset of said second group of memory units are disposed between said second control chip and another end of said first end and said second end of said circuit board.

16. The semiconductor memory module according to claim 13, wherein said first control chip is adapted to receive data signals and to transmit a respective data signal to a respective memory unit of said subset of said memory units of said first group of memory units and to a respective memory unit of said other subset of said memory units of said first group of memory units, wherein said respective memory unit of said subset of said memory units of said first group of memory units is disposed opposite said corresponding respective memory unit of said other subset of said memory units of said first group of memory units.

17. The semiconductor memory module according to claim 13, wherein said first control chip is adapted to receive data signals and to transmit a respective data signal to a respective first memory unit and to a respective second memory unit of a subset of one of said first group and said second group of memory units, said first memory unit being disposed adjacent to said second memory unit, and to a respective first memory unit and to a respective second memory unit of an other subset of said group of memory units, said second memory unit of said other subset being disposed adjacent to said first memory unit of said other subset, wherein said first memory unit of said other subset of said group is disposed opposite said first memory unit of said subset of said group on said second main surface and said second memory unit of said other subset of said group is disposed opposite said second memory unit of said subset of said group on said second main surface.

18. The semiconductor memory module according to claim 16, wherein said first control chip is adapted to delay the transmitting of said data signals with regard to the transmitting of said command and address signals.

19. The semiconductor memory module according to claim 16, wherein said first control chip is adapted to simultaneously receive data signals from said memory units of said first group of memory units and transmit data signals to said memory units of said second group of memory units.

20. The semiconductor memory module according to claim 12, further comprising a third group of memory units, wherein said first control device is adapted to transmit said command and address signals to memory units of said third group of memory units.

21. A semiconductor memory system, comprising:
a controller; and
at least one semiconductor memory module comprising:
  a substrate;
  a first control device disposed on a first main surface of said substrate and adapted to receive command and address signals from said controller;
  a second control device disposed on a first main surface of said substrate; and
  a plurality of memory units,
  wherein said second control device is adapted to receive said command and address signals from said first control device and to transmit said command and address signals to memory units of said plurality of memory units.

22. The semiconductor memory system according to claim 21, further comprising an other plurality of memory units and an other second control device, wherein said other second control device is adapted to receive said command and address signals from said first control device and to transmit said control and address signals to memory units of said other plurality of memory units.

23. A semiconductor memory arrangement comprising:
a substrate;
a first control device disposed on a first main surface of said substrate and adapted to receive command and address signals;
a second control device disposed on said first main surface of said substrate; and
a first group of memory units and a second group of memory units,
wherein said second control device is adapted to receive said command and address signals from said first control device and to transmit said command and address signals to said memory units of said first group of memory units and to said memory units of said second group of memory units.

24. The semiconductor memory arrangement according to claim 23, further comprising:
a third group of memory units and a fourth group of memory units; and
an other second control device adapted to receive said command and address signals from said first control device and to transmit said command and address signals to memory units of said third group of memory units and to memory units of said fourth group of memory units.

25. The semiconductor memory arrangement according to claim 24, wherein said substrate has a first main surface and a second main surface and a first and a second end and each of said memory units of said first group, said second group, said third group and said fourth group comprises a first and a second memory chip, and wherein said first control device and said second control device are disposed on said first main surface and said other second control device is disposed on said second main surface.

26. The semiconductor memory arrangement according to claim 25, wherein:
a subset of said memory units of said first group of memory units is disposed on said first main surface of said substrate between said first end of said substrate and said second control device;
an other subset of said memory units of said first group of memory units is disposed on said second main surface of said substrate between said first end of said substrate and said other second control device;
a subset of said memory units of said third group of memory units is disposed on said first main surface of said substrate between said first end of said substrate and said first control device; and
an other subset of said memory units of said third group of memory units is disposed on said second main surface of said substrate between said first end of said substrate and said first control device.

27. The semiconductor memory arrangement according to claim 25, wherein:
a subset of said memory units of said first group of memory units is disposed on said first main surface of said substrate between said first end of said substrate and said second control device;
an other subset of said memory units of said first group of memory units is disposed on said second main surface of said substrate between said first end of said substrate and said other second control device;

a subset of said memory units of said third group of memory units is disposed on said first main surface of said substrate between said second control device and said second end of said substrate; and an other subset of said memory units of said third group of memory units is disposed on said second main surface of said substrate between said other second control device and said second end of said substrate.

28. The semiconductor memory arrangement according to claim 27, further comprising a connector element disposed on said substrate, wherein said first control device is adapted to receive data signals from said connector element and to transmit a respective data signal to a respective memory unit of one of said subsets of said first group, said second group, said third group and said fourth group of memory units and to a respective memory unit of said other subset of said one group of memory units, wherein said memory unit of said other subset of said group is disposed opposite said memory unit of said subset of said group on said second main surface.

29. The semiconductor memory arrangement according to claim 28, wherein said first control device is adapted to receive data signals from said connector element and to transmit a respective data signal of said multiplicity of data signals to a respective first memory unit and to a respective second memory unit of said subset of one of said first group, said second group, said third group and said fourth group of memory units, said first memory unit being disposed adjacent to said second memory unit, and to a respective first memory unit and to a respective second memory unit of said other subset of said one group of memory units, said second memory unit of said other subset being disposed adjacent to said first memory unit of said other subset of said one group, wherein said first memory unit of said other subset of said one group is disposed opposite said first memory unit of said subset of said one group on said second main surface and said second memory unit of said other subset of said one group is disposed opposite said second memory unit of said subset of said one group on said second main surface.

30. The semiconductor memory arrangement according to claim 27, wherein said first control device is adapted to receive data signals, and wherein said second control device and said other second control device are adapted to receive said data signals from said first control device and to transmit a respective data signal to a respective memory unit of one of said subsets of said first group, said second group, said third group and said fourth group of memory units and to a respective memory unit of an other subset of said group of memory units, wherein said memory unit of said other subset of said group is disposed opposite said memory unit of said subset of said group on said second main surface.

31. A semiconductor memory arrangement comprising:
a substrate;
a first control means disposed on a first main surface of said substrate for receiving command and address signals;
means for storing data, and
a second control means for receiving said command and address signals from said first control means and for transmitting said command and address signals to said means for storing data, said second control means disposed on said first main surface of said substrate.

* * * * *